US012055600B2

(12) United States Patent
Arai et al.

(10) Patent No.: US 12,055,600 B2
(45) Date of Patent: Aug. 6, 2024

(54) GROUND VOLTAGE MEASURING AND METHOD

(71) Applicant: Nippon Telegraph and Telephone Corporation, Tokyo (JP)

(72) Inventors: Naruto Arai, Musashino (JP); Ken Okamoto, Musashino (JP); Jun Kato, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 325 days.

(21) Appl. No.: 17/632,130

(22) PCT Filed: Aug. 14, 2019

(86) PCT No.: PCT/JP2019/031952
§ 371 (c)(1),
(2) Date: Feb. 1, 2022

(87) PCT Pub. No.: WO2021/029040
PCT Pub. Date: Feb. 18, 2021

(65) Prior Publication Data
US 2022/0276321 A1    Sep. 1, 2022

(51) Int. Cl.
*G01R 31/52*    (2020.01)
*G01R 19/00*    (2006.01)

(52) U.S. Cl.
CPC ......... *G01R 31/52* (2020.01); *G01R 19/0084* (2013.01)

(58) Field of Classification Search
CPC ............................ G01R 19/0084; G01R 31/52
See application file for complete search history.

(56) References Cited

U.S. PATENT DOCUMENTS

| 2013/0106317 A1* | 5/2013 | Ludois ............... H02N 1/006 318/116 |
| 2018/0136264 A1* | 5/2018 | Steuer ................... G01R 1/22 |
| 2023/0146777 A1* | 5/2023 | Arai ................. G01R 27/2605 324/650 |

OTHER PUBLICATIONS

Kobayashi et al., "A Novel Non-contact Capacitive Probe for Common-Mode Voltage Measurement," IEICE Transactions on Communications, 2007, E90-B(6):1329-1337.

* cited by examiner

*Primary Examiner* — Stephanie E Bloss
*Assistant Examiner* — Michael A Harrison
(74) *Attorney, Agent, or Firm* — Fish & Richardson P.C.

(57) ABSTRACT

A device includes a resonant voltage measurement unit 10 configured to input a predetermined frequency signal to a circuit including a fixed capacitance formed between a ground and a lower electrode, a variable capacitance formed between an upper electrode that is disposed above the lower electrode and the ground or between the lower electrode and the upper electrode, and a resonance inductor to measure a resonant voltage that is dependent on a current flowing in the resonance inductor when the variable capacitance is changed to cause the circuit to resonate, a pre-correction voltage-to-ground measurement unit 20 configured to measure a pre-correction voltage-to-ground that is a voltage between a measurement electrode, which is disposed at an equal height to the lower electrode and forms a capacitance-to-ground between the measurement electrode and the ground, and a measurement probe connected to a conductor, and a voltage-to-ground correction unit 30 configured to use the fixed capacitance, the variable capacitance, and the resonant voltage to obtain the capacitance-to-ground and to calculate a voltage-to-ground obtained by correcting the pre-correction voltage-to-ground using the capacitance-to-ground.

10 Claims, 14 Drawing Sheets

Fig. 8

$$V_R = V_{output} \left\{ \frac{\frac{(Z+j\omega L)(1/j\omega C_4)}{(Z+j\omega L)+(1/j\omega C_4)}}{\frac{(Z+j\omega L)(1/j\omega C_4)}{(Z+j\omega L)+(1/j\omega C_4)}+(1/j\omega C_1)} \right\}$$

$$\times \left\{ \frac{\left(1/j\omega C_3\right)\left(\frac{(Z+j\omega L)(1/j\omega C_4)}{(Z+j\omega L)+(1/j\omega C_4)}+1/j\omega C_1\right)}{1/j\omega C_3+\frac{(Z+j\omega L)(1/j\omega C_4)}{(Z+j\omega L)+(1/j\omega C_4)}+1/j\omega C_1}}{\frac{\left(1/j\omega C_3\right)\left(\frac{(Z+j\omega L)(1/j\omega C_4)}{(Z+j\omega L)+(1/j\omega C_4)}+1/j\omega C_1\right)}{1/j\omega C_3+\frac{(Z+j\omega L)(1/j\omega C_4)}{(Z+j\omega L)+(1/j\omega C_4)}+1/j\omega C_1}+1/j\omega C_2} \right\}$$

$$\times \left\{ \frac{\left(1/j\omega C_5\right)\left(\frac{\left(1/j\omega C_3\right)\left(\frac{(Z+j\omega L)(1/j\omega C_4)}{(Z+j\omega L)+(1/j\omega C_4)}+1/j\omega C_1\right)}{1/j\omega C_3+\frac{(Z+j\omega L)(1/j\omega C_4)}{(Z+j\omega L)+(1/j\omega C_4)}+1/j\omega C_1}+1/j\omega C_2\right)}{1/j\omega C_5+\frac{\left(1/j\omega C_3\right)\left(\frac{(Z+j\omega L)(1/j\omega C_4)}{(Z+j\omega L)+(1/j\omega C_4)}+1/j\omega C_1\right)}{1/j\omega C_3+\frac{(Z+j\omega L)(1/j\omega C_4)}{(Z+j\omega L)+(1/j\omega C_4)}+1/j\omega C_1}+1/j\omega C_2}}{\frac{\left(1/j\omega C_5\right)\left(\frac{\left(1/j\omega C_3\right)\left(\frac{(Z+j\omega L)(1/j\omega C_4)}{(Z+j\omega L)+(1/j\omega C_4)}+1/j\omega C_1\right)}{1/j\omega C_3+\frac{(Z+j\omega L)(1/j\omega C_4)}{(Z+j\omega L)+(1/j\omega C_4)}+1/j\omega C_1}+1/j\omega C_2\right)}{1/j\omega C_5+\frac{\left(1/j\omega C_3\right)\left(\frac{(Z+j\omega L)(1/j\omega C_4)}{(Z+j\omega L)+(1/j\omega C_4)}+1/j\omega C_1\right)}{1/j\omega C_3+\frac{(Z+j\omega L)(1/j\omega C_4)}{(Z+j\omega L)+(1/j\omega C_4)}+1/j\omega C_1}+1/j\omega C_2}+R_{out}} \right\}$$

GROUND VOLTAGE MEASURING AND METHOD

CROSS-REFERENCE TO RELATED APPLICATIONS

This application is a National Stage application under 35 U.S.C. §371 of International Application No. PCT/JP2019/031952, having an International Filing Date of Aug. 14, 2019. The disclosure of the prior application is considered part of the disclosure of this application, and is incorporated in its entirety into this application.

TECHNICAL FIELD

The present invention relates to a voltage-to-ground measurement device that measures a voltage-to-ground of a conductor constituting each unit of an electronic device, and a method for the voltage-to-ground measurement device.

BACKGROUND ART

Electromagnetic noise may interfere with electronic apparatuses and communication apparatuses. For example, a switching type power supply circuit generates electromagnetic noise such as spike noise when the power supply circuit performs switching. When electromagnetic noise penetrates into a communication apparatus through a power cable, interference such as a communication disconnection may occur.

Because electromagnetic noise is invisible to the eyes, it is necessary to measure the voltage and the current of the cable or the like around an apparatus in which interference has occurred, using a measurement instrument to search for the source that has generated the electromagnetic noise that has caused the interference. In particular, a return path of the electromagnetic noise is often the ground at which the device is grounded and a conductor constituting each unit of the device. Thus, it is important to measure the voltage-to-ground of the electromagnetic noise.

In order to measure a voltage-to-ground, for example, a measurement instrument needs to be grounded and then a passive probe or a non-contact capacitive voltage probe needs to come in contact with a measurement target as disclosed in NPL 1.

CITATION LIST

Non Patent Literature

NPL 1: R. Kobayashi, Y. Hiroshima, H. Ito, H. Furuya, M. Hattori, and Y. Tada, "A Novel Non-contact Capacitive Probe for Common-Mode Voltage Measurement", IEICE TRANS. COMMUN., vol. E90-B, No. 6, 2007.

SUMMARY OF THE INVENTION

Technical Problem

In the measurement method of the related art, it is not possible to measure a voltage-to-ground unless the measurement instrument is grounded as described above. In order to have the measurement instrument grounded, a worker may need to perform work involving a heavy burden, such as driving a grounding rod into the ground. Furthermore, a reference voltage of the measurement instrument is indefinite in an environment in which grounding is difficult, and thus accurate measurement may not be possible even if a probe is brought into contact with the measurement target. That is, unfortunately, a measurement instrument of the related art must be grounded in measuring a voltage-to-ground.

The present invention has been conceived in view of the problem and aims to provide a voltage-to-ground measurement device and a method for measuring the voltage-to-ground that enable a voltage-to-ground to be measured without having a measurement instrument grounded.

Means for Solving the Problem

A voltage-to-ground measurement device according to an aspect of the present invention is a voltage-to-ground measurement device that measures a voltage-to-ground of a conductor constituting a unit of an electronic apparatus, the voltage-to-ground measurement device including a resonant voltage measurement unit configured to input a predetermined frequency signal to a circuit including a fixed capacitance formed between a ground and a lower electrode, a variable capacitance formed between an upper electrode that is disposed above the lower electrode and the ground or between the lower electrode and the upper electrode, and a resonance inductor to measure a resonant voltage that is dependent on a current flowing in the resonance inductor when the variable capacitance is changed to cause the circuit to resonate, a pre-correction voltage-to-ground measurement unit configured to measure a pre-correction voltage-to-ground that is a voltage between a measurement electrode, which is disposed at an equal height to the lower electrode and forms a capacitance-to-ground between the measurement electrode and the ground, and a measurement probe connected to the conductor, and a voltage-to-ground correction unit configured to use the fixed capacitance, the variable capacitance, and the resonant voltage to obtain the capacitance-to-ground and to calculate a voltage-to-ground obtained by correcting the pre-correction voltage-to-ground using the capacitance-to-ground.

In addition, a voltage-to-ground measurement method according to an aspect of the present invention is a voltage-to-ground measurement method performed by a voltage-to-ground measurement device, the voltage-to-ground measurement method including forming a fixed capacitance and a variable capacitance between any of a lower electrode and an upper electrode disposed at different heights from a ground and the ground and inputting a predetermined frequency signal to a circuit including the fixed capacitance, the variable capacitance, and a resonance inductor to measure a resonant voltage that is dependent on a current flowing in the resonance inductor when the variable capacitance is changed to cause the circuit to resonate, measuring a pre-correction voltage-to-ground that is a voltage between a measurement electrode, which is disposed at an equal height to the lower electrode and forms a capacitance-to-ground between the measurement electrode and the ground, and a measurement probe connected to a conductor constituting a unit of an electronic apparatus that is a measurement target, and using the fixed capacitance, the variable capacitance, and the resonant voltage to obtain the capacitance-to-ground and to calculate a voltage-to-ground obtained by correcting the pre-correction voltage-to-ground using the capacitance-to-ground.

Effects of the Invention

According to the present invention, it is possible to provide a voltage-to-ground measurement device and a method for the voltage-to-ground measurement device that enable a voltage-to-ground to be measured without having a measurement instrument being grounded.

BRIEF DESCRIPTION OF DRAWINGS

FIG. 8 is a diagram illustrating an equation expressing a relationship between a resonant voltage and an output voltage of an oscillation unit.

DESCRIPTION OF EMBODIMENTS

Hereinafter, embodiments of the present invention will be described with reference to the accompanying drawings. The same reference signs are given to the same constituent elements which are the same in the plurality of drawings, and description thereof is not repeated.

First Embodiment

Figure 1:
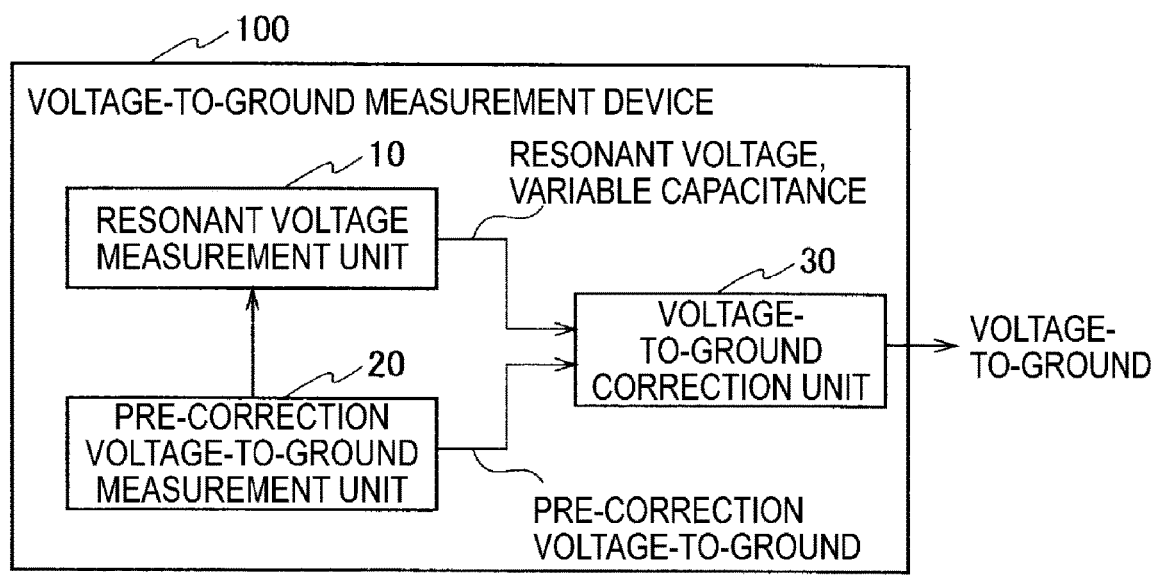
FIG. 1 is a block diagram illustrating a functional configuration example of a voltage-to-ground measurement device according to a first embodiment of the present invention.

FIG. 1 is a block diagram illustrating a functional configuration example of a voltage-to-ground measurement device according to a first embodiment of the present invention. The voltage-to-ground measurement device 100 illustrated in FIG. 1 is a device for measuring a voltage-to-ground of a conductor constituting each unit of an electronic apparatus that is a measurement target.

The voltage-to-ground measurement device 100 includes a resonant voltage measurement unit 10, a pre-correction voltage-to-ground measurement unit 20, and a voltage-to-ground correction unit 30. None of these functional constituent units is grounded directly to the ground.

The resonant voltage measurement unit 10 inputs a predetermined frequency signal to a circuit including a fixed capacitance formed between the ground and a lower electrode, a variable capacitance formed between an upper electrode disposed above the lower electrode and the ground or between the lower electrode and the upper electrode, and a resonance inductor to measure a resonant voltage that is dependent on a current flowing in the resonance inductor when the variable capacitance is changed to cause the circuit to resonate. The fixed capacitance, the variable capacitance, and the resonant voltage will be described in detail below.

The pre-correction voltage-to-ground measurement unit 20 measures a pre-correction voltage-to-ground which is the voltage between a measurement electrode that is disposed at an equal height to the lower electrode and forms a capacitance-to-ground between the measurement electrode and the ground and a measurement probe connected to the conductor. The details will be described below.

The voltage-to-ground correction unit 30 obtains a capacitance-to-ground using the fixed capacitance, the variable capacitance, and the resonant voltage and calculates a voltage-to-ground by correcting a pre-correction voltage-to-ground measured by the pre-correction voltage-to-ground measurement unit 20 using the obtained capacitance-to-ground. The details will be described below.

According to the voltage-to-ground measurement device 100 of the present embodiment, an underrated pre-correction voltage-to-ground measured by the pre-correction voltage-to-ground measurement unit 20 can be corrected using capacitance information and voltage information at the time of resonance of the resonant voltage measurement unit 10. The corrected voltage-to-ground is equal to the voltage-to-ground measured by grounding a measurement instrument.

An operation of each functional constituent unit of the voltage-to-ground measurement device 100 will be described in detail below with reference to the drawings.

Resonant Voltage Measurement Unit

Figure 2:
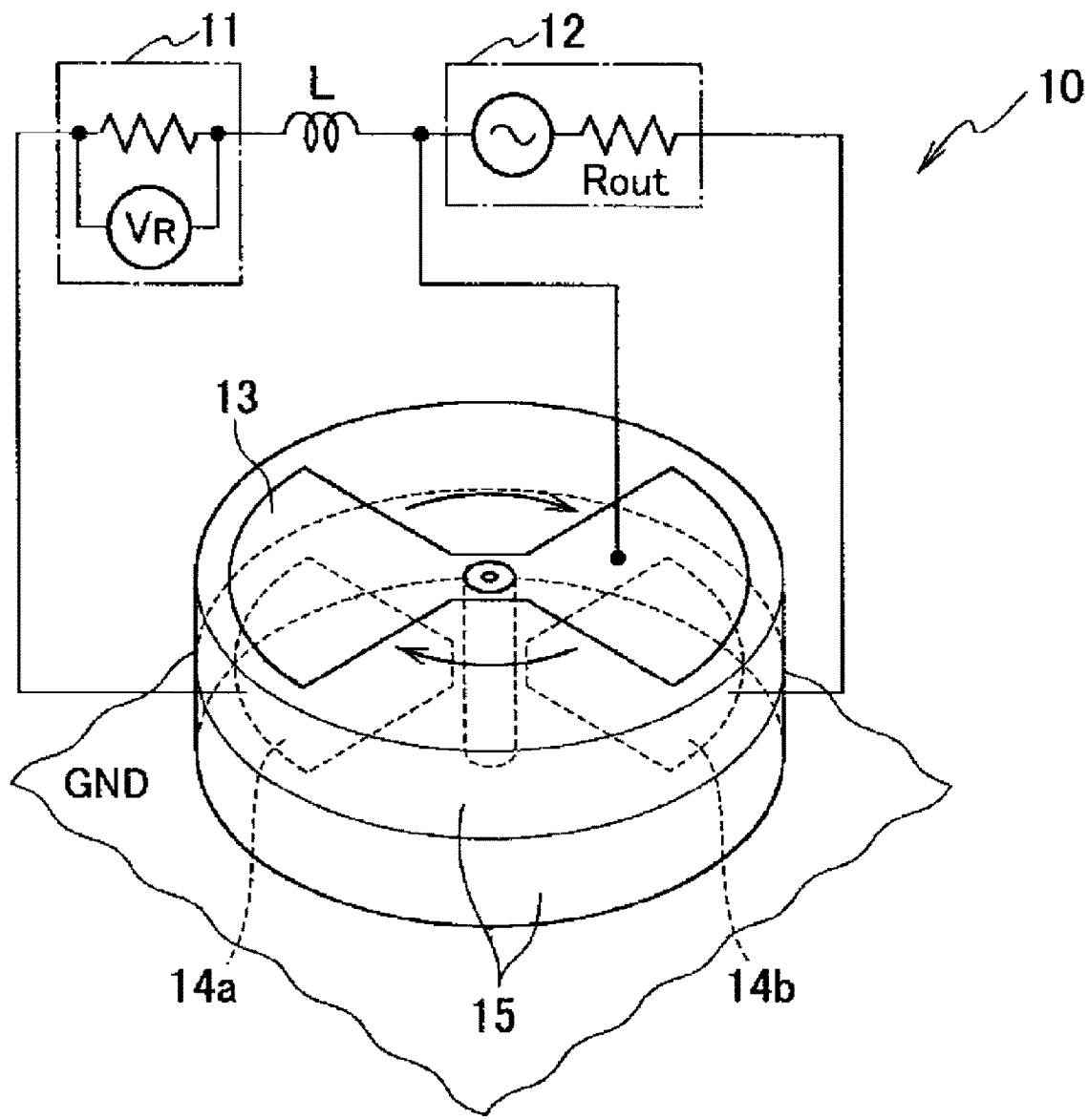
FIG. 2 is a diagram schematically illustrating a specific configuration example of a resonant voltage measurement unit illustrated in FIG. 1.

FIG. 2 is a diagram schematically illustrating a specific configuration example of the resonant voltage measurement unit 10. The resonant voltage measurement unit 10 includes a resonance inductor L, a voltage measurement unit 11, an oscillation unit 12, two lower electrodes 14a and 14b, an upper electrode 13, and two spacers 15.

As illustrated in FIG. 2, the lower electrodes 14a and 14b are disposed to be separated from the ground GND at heights equal to the thickness of the spacers 15. Furthermore, the lower electrodes 14a and 14b are disposed parallel to the ground GND.

The upper electrode 13 is disposed to face the lower electrodes 14a and 14b via the spacers 15. The spacers 15 are formed of a dielectric material.

The lower electrodes 14a and 14b have, for example, fan shapes each having a center angle of 90 degrees with the center portion cut and the areas of the two fan shapes are equal. The upper electrode 13 has the same fan shape as the lower electrodes 14a and 14b, for example, in which the center portion is connected.

The upper electrode 13 is rotatable about a central shaft 16 that is perpendicular to the ground GND. When the upper electrode 13 is rotated, the area in which the upper electrode 13 faces the lower electrodes 14a and 14b changes. Thus, a static capacitance between the upper electrode 13 and the lower electrodes 14a and 14b and a static capacitance between the upper electrode 13 and the ground GND can be changed due to an angle of rotation of the upper electrode 13.

Figure 3:
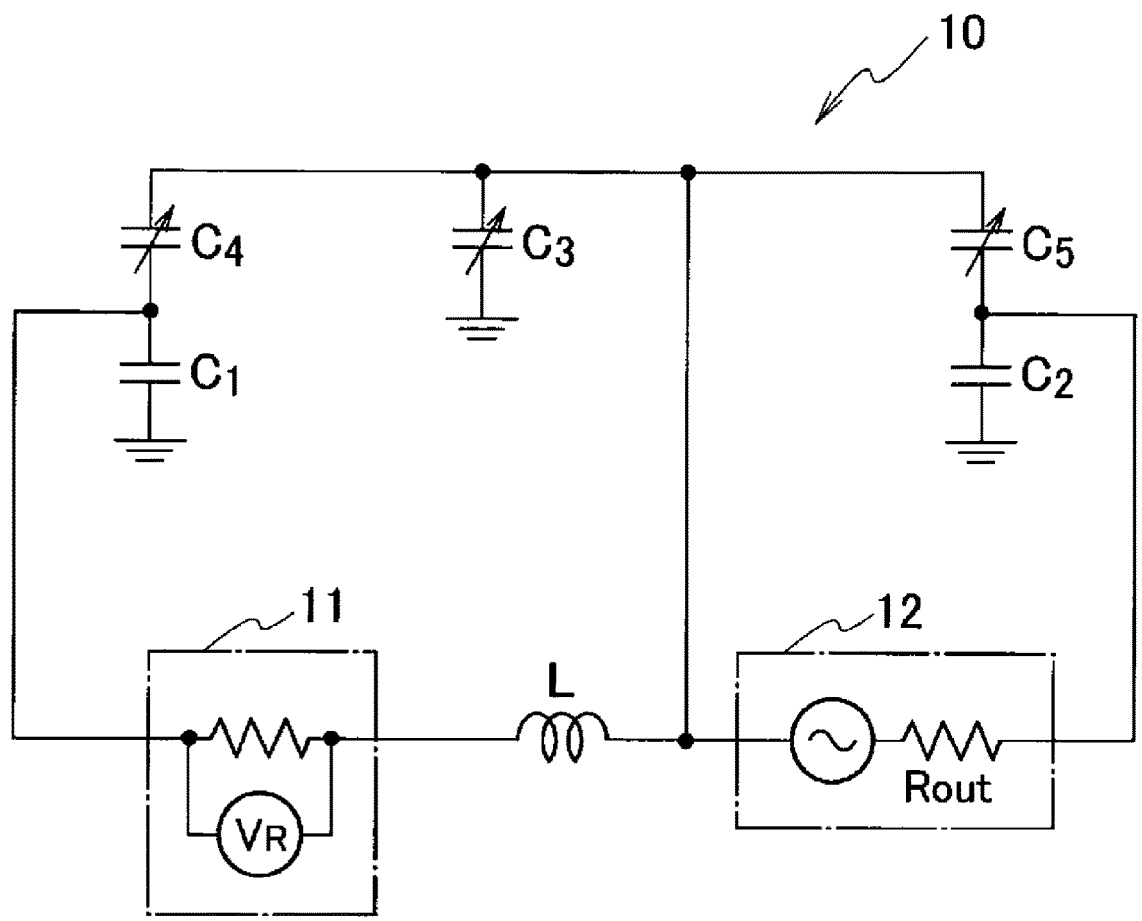
FIG. 3 is a diagram illustrating an equivalent circuit including a resonance inductor illustrated in FIG. 2.

FIG. 3 illustrates an equivalent circuit of the resonant voltage measurement unit 10 including these static capacitances. The lower electrodes 14a and 14b and the upper electrode 13 form fixed capacitances $C_1$ and $C_2$ and variable capacitances $C_3$ to $C_5$ between each of the lower electrodes 14a and 14b and the upper electrode 13 or between the ground GND and each of the electrodes.

The fixed capacitance $C_1$ is, for example, a static capacitance between the lower electrode 14a and the ground GND. The fixed capacitance $C_2$ is, for example, a static capacitance between the lower electrode 14b and the ground GND. The fixed capacitances $C_1$ and $C_2$ do not change even when the upper electrode 13 is rotated.

The variable capacitance $C_3$ is a static capacitance between the upper electrode 13 and the ground GND. The variable capacitance $C_4$ is, for example, a static capacitance between the lower electrode 14a and the upper electrode 13. The variable capacitance $C_5$ is, for example, a static capacitance between the lower electrode 14b and the upper electrode 13. The static capacitances of the variable capacitances $C_3$ to $C_5$ change according to an angle of rotation of the upper electrode 13.

The lower electrode 14a (the fixed capacitance $C_1$) is connected to one end of the voltage measurement unit 11, and the other end of the voltage measurement unit 11 is connected to one end of the resonance inductor L. The other end of the resonance inductor L is connected to the upper electrode 13 (variable capacitances $C_3$ to $C_5$).

In addition, the upper electrode 13 is connected to one end of the oscillation unit 12. The other end of the oscillation unit 12 is connected to the lower electrode 14b (the fixed capacitance $C_2$).

These fixed capacitances $C_1$ and $C_2$, the variable capacitances $C_3$ to $C_5$, and the resonance inductor L resonate at a certain frequency. The resonance frequency changes according to a value of the variable capacitances $C_3$ to $C_5$.

When the resonance frequency matches the frequency of a frequency signal output from the oscillation unit 12, the voltage measured by the voltage measurement unit 11 has a maximum value. The frequency of the frequency signal output by the oscillation unit 12 is preset to a predetermined frequency in a frequency range that changes according to a value of the variable capacitances $C_3$ to $C_5$.

Figure 4:
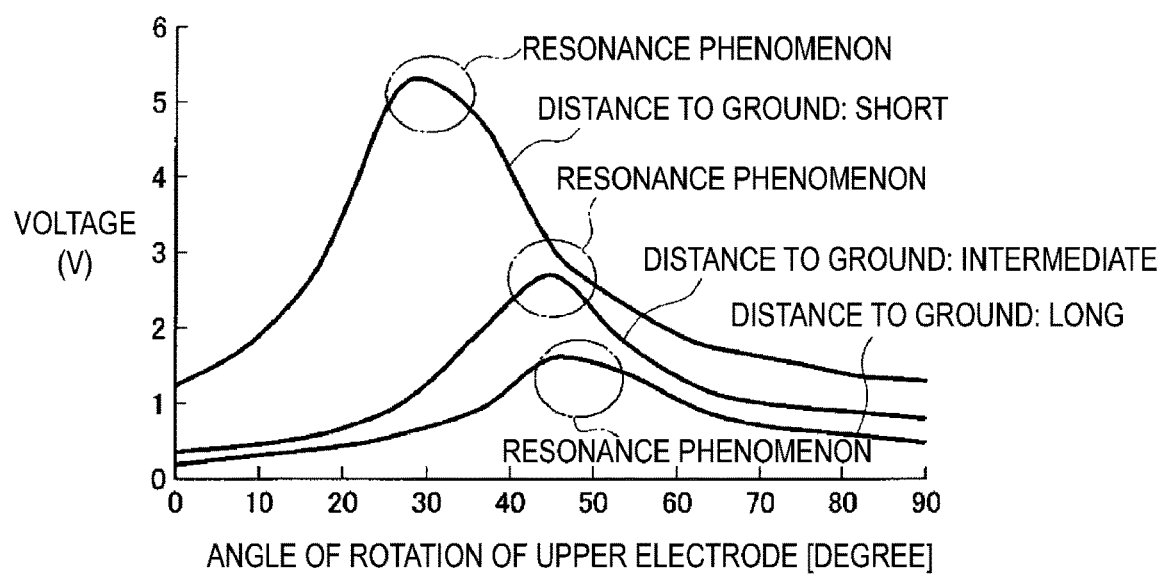
FIG. 4 is a diagram schematically illustrating change in a resonant voltage in a case in which the upper electrode illustrated in FIG. 2 is rotated to change a variable capacitance.

FIG. 4 is a diagram schematically illustrating change in the voltage measured by the voltage measurement unit 11 when the upper electrode 13 is rotated. The horizontal axis in FIG. 4 represents an angle of rotation [degree] of the upper electrode 13, and the vertical axis represents a voltage [V] measured by the voltage measurement unit 11. "Distance to ground" illustrated in FIG. 4 is the distance between the lower electrodes 14a and 14b and the ground GND.

As illustrated in FIG. 4, as the distance between the lower electrodes 14a and 14b and the ground GND becomes shorter, the voltage measured by the voltage measurement unit 11 becomes higher. This is because, as the distance between the lower electrodes 14a and 14b and the ground GND becomes shorter, the values of the fixed capacitances $C_1$ and $C_2$ and the variable capacitances $C_3$ to $C_5$ become greater, and the current flowing in the resonance inductor L increases.

The resonant voltage measurement unit 10 of the present embodiment thus enables the voltage measured by the voltage measurement unit 11 to be increased without changing the voltage level of the frequency signal output by the oscillation unit 12. As a result, the relationship in the static capacitances and the voltage between the ground GND can be measured with a simpler configuration and reliability. In other words, the configuration in which the upper electrode 13 is rotated, for example, is simpler than the configuration in which the frequency and the voltage level of the frequency signal output by the oscillation unit 12 are changed. In addition, the voltage level can be increased by using the resonance phenomenon, and thus measurement of the voltage can be facilitated.

As described above, the resonant voltage measurement unit 10 includes the two lower electrodes 14a and 14b disposed at an equal height and parallel to the ground GND and the upper electrode 13 disposed to face the lower electrodes 14a and 14b with a dielectric (the spacers 15) interposed between the electrodes, and the lower electrodes 14a and 14b or the upper electrode 13 can be rotated about the central shaft 16 that is perpendicular to the ground GND. As a result, the relationship in the static capacitances and the voltage between the ground GND can be measured with a simpler configuration and reliability.

The values of the resonant voltage measured by the voltage measurement unit 11 and the fixed capacitances $C_1$ and $C_2$ and the variable capacitances $C_3$ to $C_5$ are output to the voltage-to-ground correction unit 30. The values of the fixed capacitances $C_1$ and $C_2$ and the variable capacitances $C_3$ to $C_5$ may be angle information detected by a rotary encoder (not illustrated) attached to the central shaft 16. The relationship between the angle information and the static capacitances will be described below.

Pre-Correction Voltage-to-Ground Measurement Unit

Figure 5:
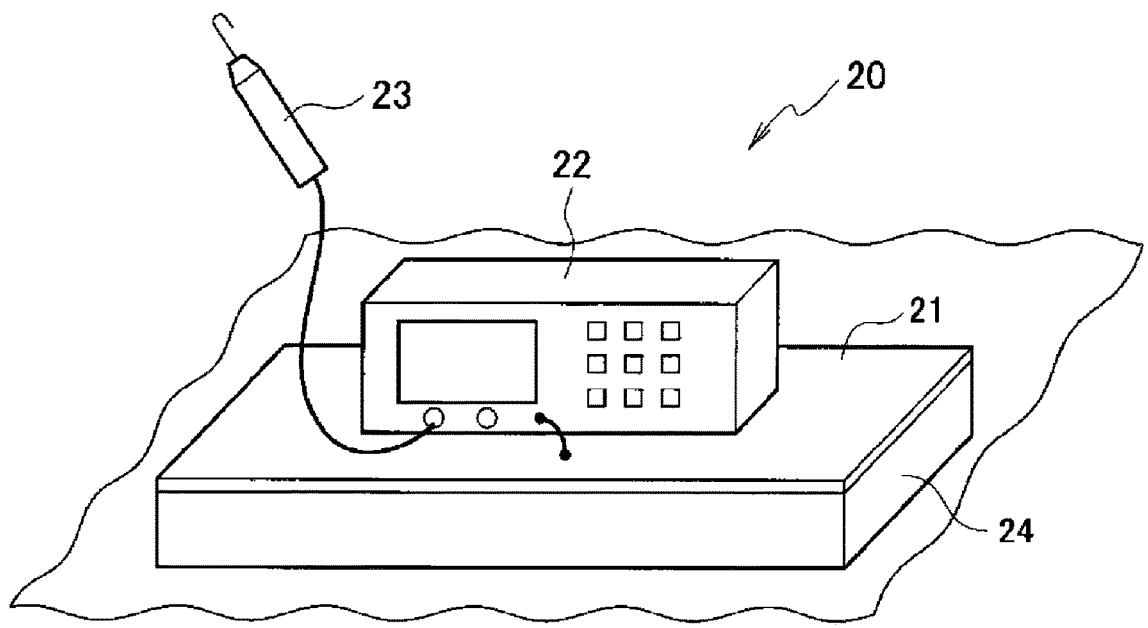
FIG. 5 is a diagram schematically illustrating a configuration example of a pre-correction voltage-to-ground measurement unit illustrated in FIG. 1.

FIG. 5 is a diagram schematically illustrating a configuration example of the pre-correction voltage-to-ground measurement unit 20. The pre-correction voltage-to-ground measurement unit 20 includes a spacer 24, a measurement electrode 21, a voltage measurement device 22, and a measurement probe 23.

The measurement electrode 21 is disposed on the spacer 24 that is placed on the top of the ground GND. The spacer 24 is formed of a dielectric material, and forms a capacitance-to-ground Ce between the measurement electrode 21 and the ground GND.

The voltage measurement device 22 that connects a grounding electrode to the measurement electrode 21 is disposed on the measurement electrode 21. The voltage measurement device 22 is, for example, a battery-driven oscilloscope. The measurement electrode 21 is disposed at an equal height to the lower electrodes 14a and 14b.

The measurement probe 23 which is a measurement terminal of the voltage measurement device 22 is connected to any of a plurality of conductors constituting each unit of an electronic apparatus that is a measurement target. A pre-correction voltage-to-ground measured by the voltage measurement device 22 that is not grounded as described above is output to the voltage-to-ground correction unit 30.

The pre-correction voltage-to-ground measurement unit 20 thus measures the pre-correction voltage-to-ground which is the voltage between the measurement electrode 21 that is disposed at the equal height to the lower electrodes 14a and 14b and forms a capacitance-to-ground between the measurement electrode 21 and the ground GND, and the measurement probe 23 connected to any of the plurality of conductors constituting units of the electronic device that is a measurement target.

Voltage-to-Ground Correction Unit

Figure 6:
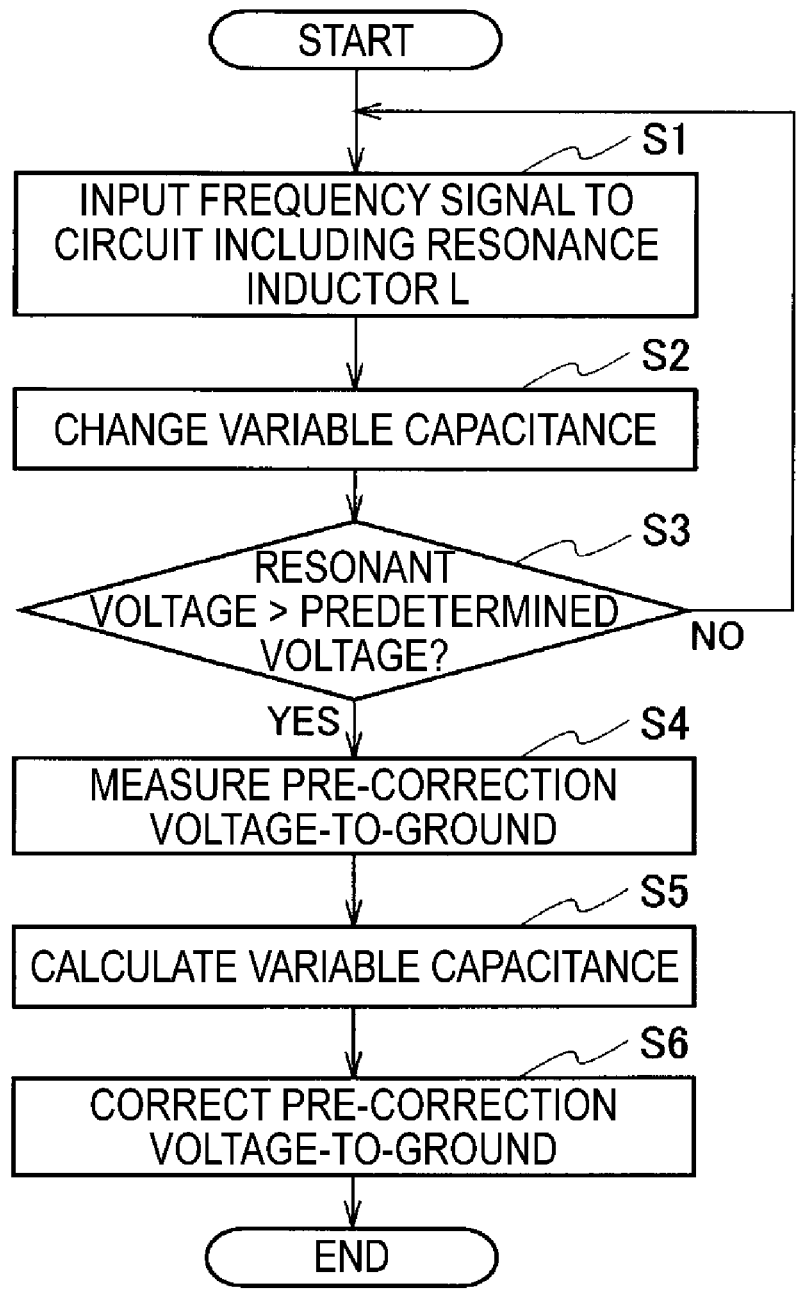
FIG. 6 is a flowchart illustrating a processing procedure of the voltage-to-ground measurement device illustrated in FIG. 1.

FIG. 6 is a flowchart illustrating a processing procedure of the voltage-to-ground measurement device 100. An operation of the voltage-to-ground correction unit 30 and other functional constituent units will be described with reference to FIG. 6.

When an operation starts, the voltage-to-ground measurement device 100 inputs a frequency signal to a circuit including the resonance inductor L (step S1). The frequency signal is a single frequency sine wave. The input of the frequency signal is started by a control unit (not illustrated) outputting a control signal that instructs the oscillation unit 12 of the resonant voltage measurement unit 10 to output the frequency signal.

Next, the upper electrode 13 is rotated to change the variable capacitances $C_3$ to $C_5$ (step S2). The rotation of the upper electrode 13 may be performed manually by a worker or may be performed by driving a drive unit (not illustrated) connected to the central shaft 16.

While the upper electrode 13 is rotated (step S2), the voltage measurement unit 11 measures a resonant voltage that is dependent on the current flowing in the resonance inductor L (step S3). The measurement of the resonant voltage is repeated until the voltage exceeds a predetermined voltage which is a measurable voltage (a loop when the answer is NO in step S3).

By repeating the loop when the answer is NO in step S3, the voltage measurement unit 11 can measure a high level resonant voltage. At the same time, the voltage measurement unit 11 can obtain the values of the variable capacitances $C_3$ to $C_5$.

If the resonant voltage exceeds the predetermined voltage (YES in step S3), the pre-correction voltage-to-ground measurement unit 20 measures the pre-correction voltage-to-ground of the conductor of the electronic apparatus (step S4). The instruction for measurement may be given to the pre-correction voltage-to-ground measurement unit 20 by the resonant voltage measurement unit 10 or the control unit (not illustrated). At this time, the resonant voltage measurement unit 10 outputs the values of the resonance voltage and the variable capacitances $C_3$ to $C_5$ to the voltage-to-ground correction unit 30.

In this example, the resonant voltage measurement unit 10 outputs the values of the variable capacitances $C_3$ to $C_5$ as the rotation angle θ obtained from the rotary encoder (not illustrated) connected to the central shaft 16. The voltage-to-ground correction unit 30 calculates the values of the variable capacitances $C_3$ to $C_5$ from the rotation angle θ input from the resonant voltage measurement unit 10 (step S5). The calculation formula will be described below.

Figure 7:
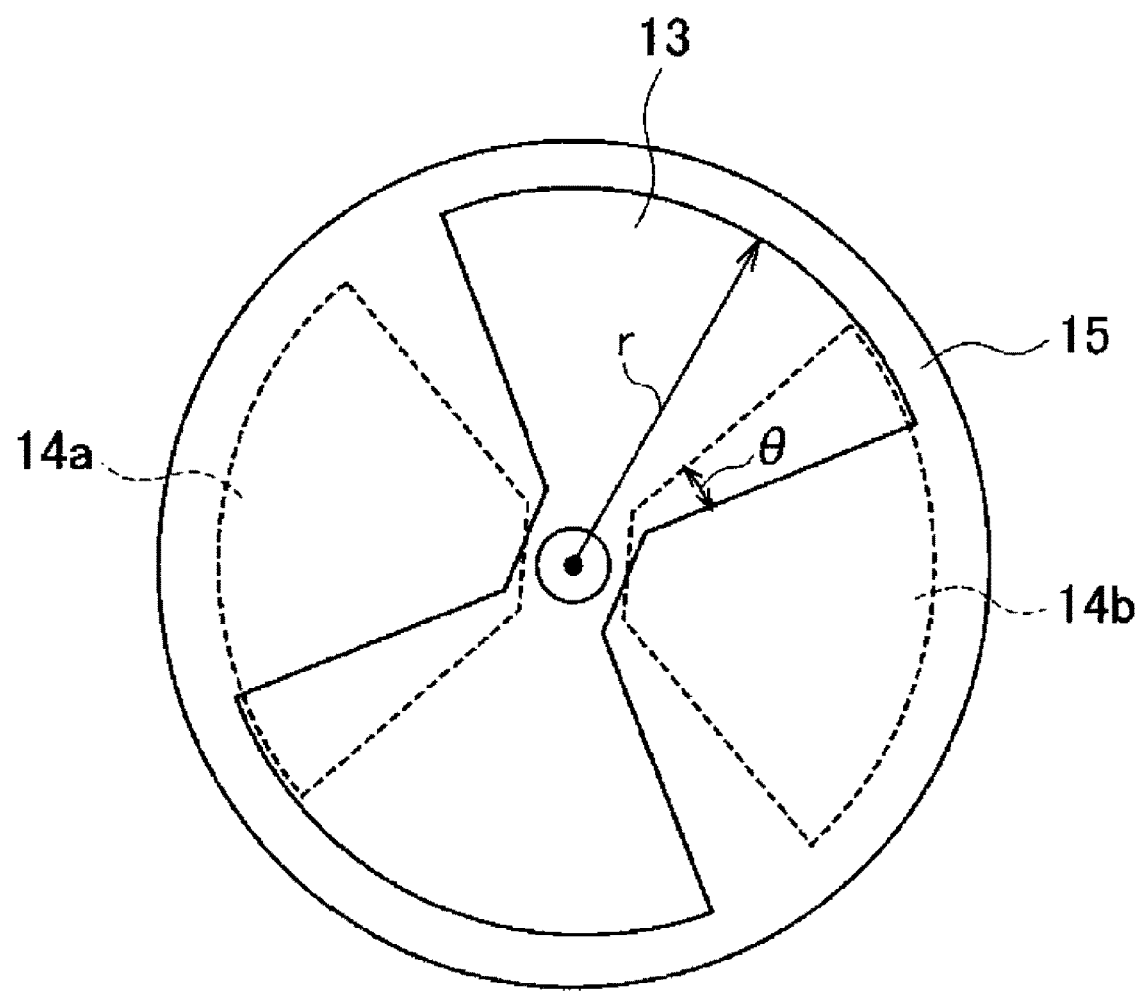
FIG. 7 is a diagram illustrating an example of a plan view of the upper electrode and the lower electrode illustrated in FIG. 2.

FIG. 7 is a plan view of the upper electrode 13 and the lower electrodes 14a and 14b viewed from the upper electrode 13 side. As illustrated in FIG. 7, the variable capacitances $C_4$ and $C_5$ can be calculated with the rotation angle θ and the radius r of the upper electrode 13 using the following equation.

[Math. 1]

$$C_4 = C_5 = \varepsilon_0 \varepsilon_r \frac{r^2 \theta}{2d} \quad (1)$$

Here, $\varepsilon_0$ is an electric constant, $\varepsilon_r$ is a relative dielectric constant of the spacer 15, and d is a distance between the upper electrode 13 and the lower electrodes 14a and 14b. Note that the equation (1) is different if the upper electrode 13 and the lower electrodes 14a and 14b have different shapes from those in the above-described example.

After the variable capacitances $C_4$ and $C_5$ are calculated, the voltage-to-ground correction unit 30 calculates the fixed capacitances $C_1$ and $C_2$ and the variable capacitance $C_3$ using a constant δ expressed by the following equation.

[Math. 2]

$$C_1 = \frac{\varepsilon_0 S_1}{\delta} \quad (2)$$

$$C_2 = \frac{\varepsilon_0 S_2}{\delta} \quad (3)$$

$$C_3 = \frac{\varepsilon_0 (S_3 - S_1 - S_2)}{\frac{d}{\varepsilon_r} + \delta} \quad (4)$$

Here, $S_1$ is the area of the lower electrode 14a, $S_2$ is the area of the lower electrode 14b, and $S_3$ is the area of the upper electrode 13.

Next, the voltage-to-ground correction unit 30 corrects the pre-correction voltage-to-ground (step S6).

Method for Correcting Pre-Correction Voltage-to-Ground

A method for correcting a pre-correction voltage-to-ground will now be described.

FIG. 8 is a diagram illustrating an equation expressing a relationship between a resonant voltage VR and a voltage $V_{output}$ of a frequency signal output by the oscillation unit 12. As illustrated in FIG. 8, the relationship between the resonant voltage $V_R$ and the voltage $V_{output}$ of the frequency signal is a little complex and difficult to see.

Thus, an equation obtained by making the equation (FIG. 8) easier to see is shown as follows.

[Math. 3]

$$V_R = V_{output} \frac{\alpha}{\alpha + \frac{1}{j\omega C_1}} \frac{\beta}{\beta + \frac{1}{j\omega C_2}} \frac{\gamma}{\gamma + R_{out}} \quad (5)$$

$$\alpha = \frac{(Z + j\omega L)\frac{1}{j\omega C_4}}{(Z + j\omega L) + \frac{1}{j\omega C_4}} \quad (6)$$

$$\beta = \frac{\frac{1}{j\omega C_3}\left(\alpha + \frac{1}{j\omega C_1}\right)}{\frac{1}{j\omega C_3} + \alpha + \frac{1}{j\omega C_1}} \quad (7)$$

$$\gamma = \frac{\frac{1}{j\omega C_5}\left(\beta + \frac{1}{j\omega C_2}\right)}{\frac{1}{j\omega C_5} + \beta + \frac{1}{j\omega C_2}} \quad (8)$$

Here, ω is an angular frequency of a frequency signal output by the oscillation unit 12, and Z is an input impedance of the voltage measurement unit 11. The equations (2) to (8)

are solved for a constant δ. The obtained constant δ and the known value (for example, the area $S_1$ of the lower electrode 14a, etc.) are used to calculate the values of the fixed capacitances $C_1$ and $C_2$ and the variable capacitance $C_3$ using the equations (2) to (4).

Next, the voltage-to-ground correction unit 30 calculates a capacitance-to-ground Cm, which is the static capacitance between the measurement electrode 21 of the pre-correction voltage-to-ground measurement unit 20 and the ground GND using the following equation.

[Math. 4]

$$C_m = \frac{\varepsilon_0 S_m}{\delta} \quad (9)$$

Here, $S_m$ is an area of the measurement electrode 21.

Then, the voltage-to-ground correction unit 30 corrects the pre-correction voltage-to-ground $V_m$ measured by the pre-correction voltage-to-ground measurement unit 20 using the following equation to obtain a voltage-to-ground $V_n$.

[Math. 5]

$$V_n = V_m\left(1 + \frac{1}{j\omega C_m}\frac{1}{Z_m}\right) \quad (10)$$

Here, $Z_m$ is an input impedance including the measurement probe 23 of the pre-correction voltage-to-ground measurement unit 20.

Figure 9:
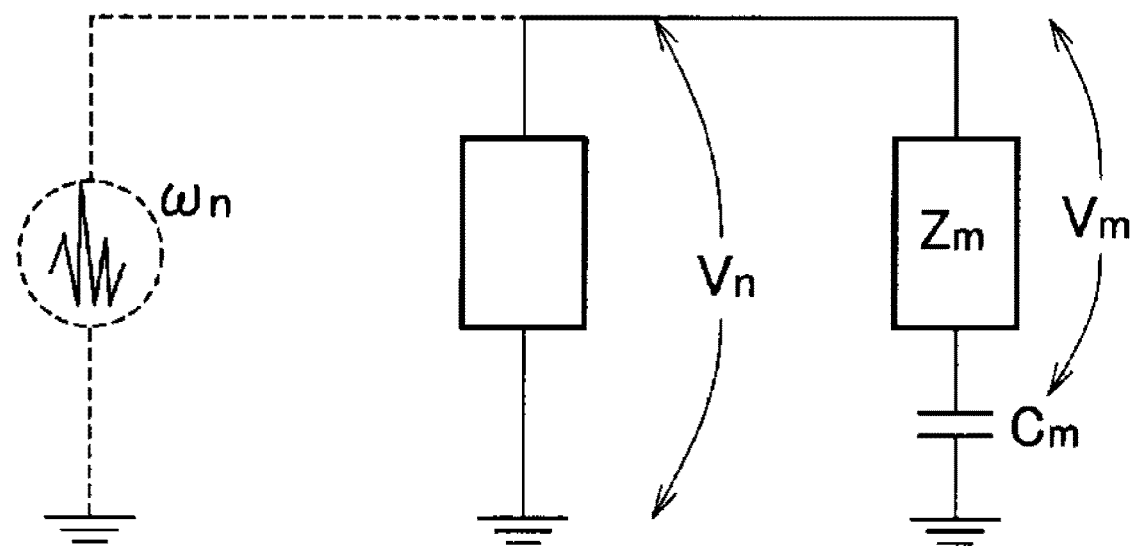
FIG. 9 is a diagram illustrating an equivalent circuit in a case in which the pre-correction voltage-to-ground measurement unit illustrated in FIG. 1 measures a voltage-to-ground.

FIG. 9 is an equivalent circuit illustrating a relationship between the voltage-to-ground $V_n$ and the pre-correction voltage-to-ground $V_m$. As illustrated in FIG. 9, the underrated pre-correction voltage-to-ground $V_m$ is corrected to the correct voltage-to-ground $V_n$ using the equation (10). In this way, the voltage-to-ground measurement device 100 according to the present embodiment can measure the accurate voltage-to-ground $V_n$ without grounding the voltage measurement device 22.

Second Embodiment

Although the above embodiment has been described in an example in which a battery-driven oscilloscope is used for the voltage measurement device 22, a voltage-to-ground measurement device according to the present invention can be provided without using such a general-purpose voltage measurement device.

Here, an example in which a body of a worker is used for a measurement probe will be described. The present embodiment introduces an example in which the resonant voltage measurement unit 10 described above is housed in the sole of one shoe of a worker and the pre-correction voltage-to-ground measurement unit 20 is housed in the sole of the other shoe of the worker. The voltage-to-ground correction unit 30 is housed in the sole of either shoe of the worker.

If the voltage-to-ground correction unit 30 is housed in the same shoe as the resonant voltage measurement unit 10, a pre-correction voltage-to-ground $V_m$ measured by the pre-correction voltage-to-ground measurement unit 20 of the other shoe is transmitted wirelessly to the voltage-to-ground correction unit 30. In addition, if the voltage-to-ground correction unit 30 is housed in the same shoe as the pre-correction voltage-to-ground measurement unit 20, a resonant voltage VR or the like measured by the resonant voltage measurement unit 10 in the other shoe is transmitted wirelessly to the voltage-to-ground correction unit 30. Bluetooth, for example, is used for the wireless transmission in this case.

Basic configurations of the resonant voltage measurement unit 10, the pre-correction voltage-to-ground measurement unit 20, and the voltage-to-ground correction unit 30 according to the present embodiment are the same as those of the above-described embodiment. Hereinafter, differences from the first embodiment will be described.

Figure 10:
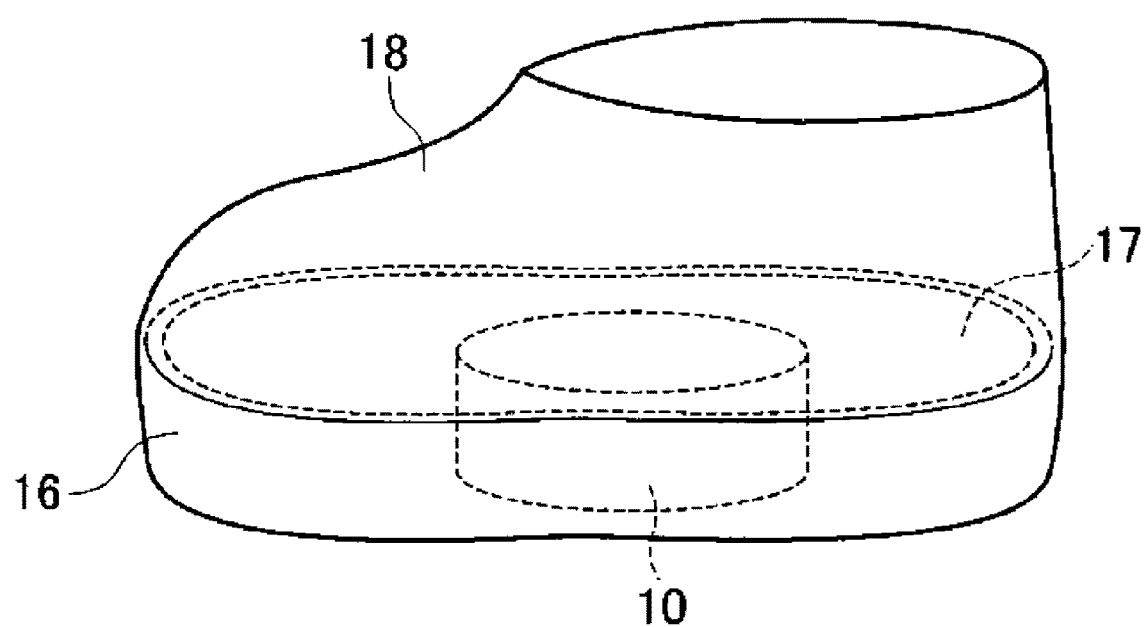
FIG. 10 is a diagram schematically illustrating a state of one shoe in which a resonant voltage measurement unit of a voltage-to-ground measurement device according to a second embodiment of the present invention is housed.

FIG. 10 is a diagram schematically illustrating a state in which the resonant voltage measurement unit 10 is housed in the sole of one shoe worn by a worker. As illustrated in FIG. 10, the resonant voltage measurement unit 10 is housed in a portion of a sole 17 of a shoe constituted by the sole 17, an insole 18, and an upper 19.

Further, in the present embodiment, it is not possible to directly operate (rotate) the upper electrode 13. Thus, the upper electrode 13 is constantly rotated at the time of measurement by a drive unit (not illustrated) connected to the central shaft 16. A speed of rotation is, for example, approximately 60 rpm.

The upper electrode 13 may be continuously rotated in this manner. A resonant voltage $V_R$ and a static capacitance when a resonant voltage $V_R$ is obtained is only required to be combined and output to the voltage-to-ground correction unit 30.

Figure 11:
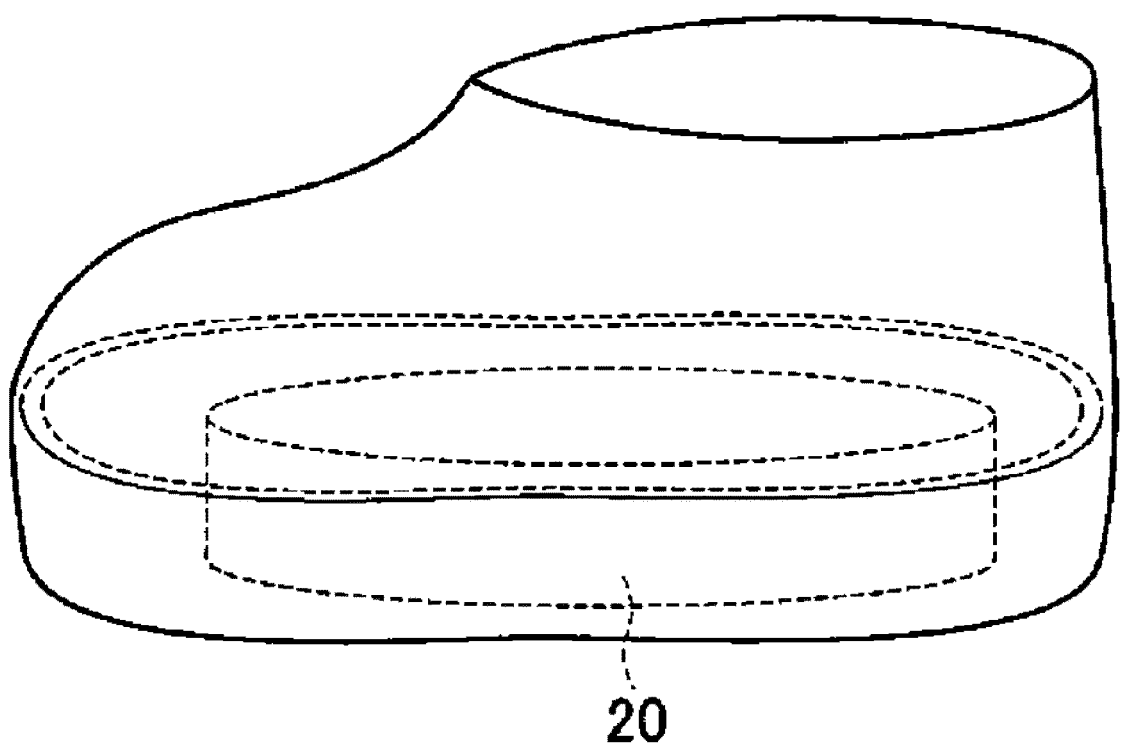
FIG. 11 is a diagram schematically illustrating a state of another shoe in which a pre-correction voltage-to-ground measurement unit of a voltage-to-ground measurement device according to the second embodiment of the present invention is housed.

FIG. 11 is a diagram schematically illustrating a state in which the pre-correction voltage-to-ground measurement unit 20 is housed in the sole of the other shoe worn by the worker. As illustrated in FIG. 11, the pre-correction voltage-to-ground measurement unit 20 is housed in a portion of the sole 17. Note that, in the present embodiment, the shape of the measurement electrode 21 and the configuration of the voltage measurement device 22 are different because it is not possible to house a battery-driven oscilloscope in the sole 17.

Figure 12:
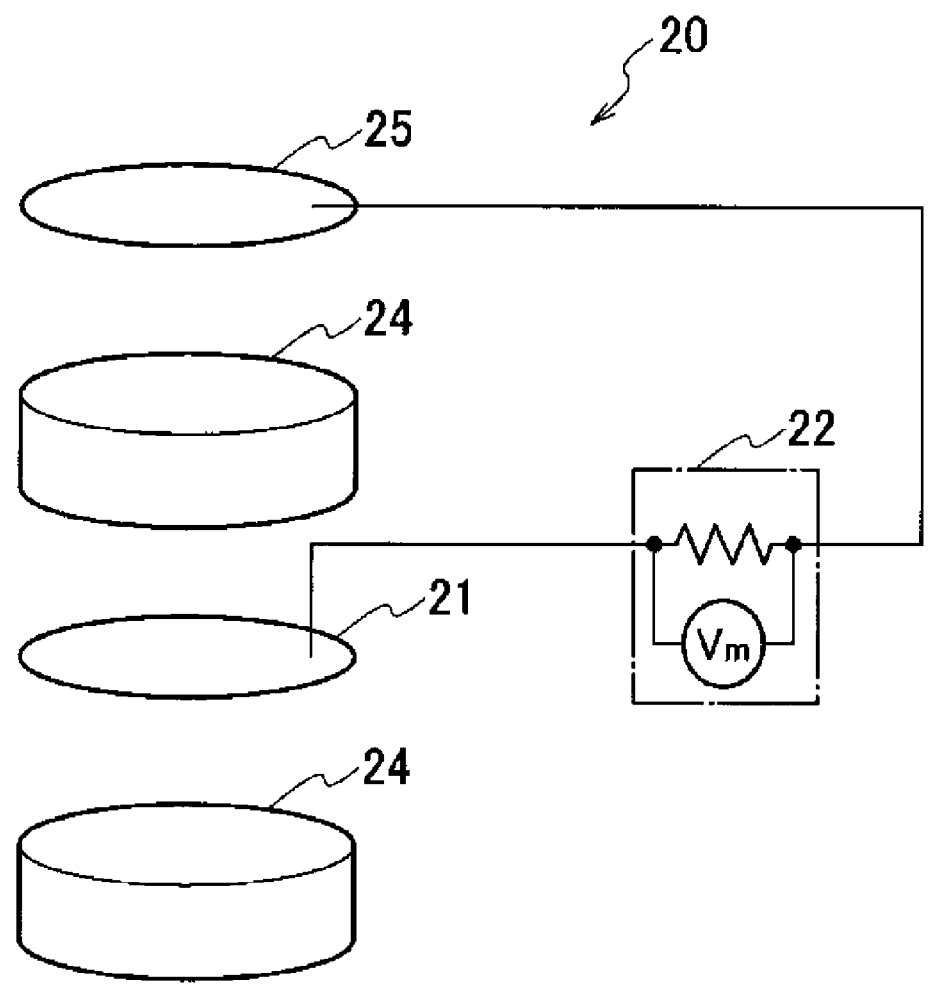
FIG. 12 is a diagram illustrating a configuration example of the pre-correction voltage-to-ground measurement unit illustrated in FIG. 11.

FIG. 12 is a diagram illustrating a configuration of the measurement electrode 21 and the voltage measurement device 22 according to the present embodiment. As illustrated in FIG. 12, the voltage measurement device 22 is replaced with a voltmeter. The small voltmeter 22 that is able to be housed in the sole 17 can be easily provided by combining a typical A/D converter with a reference voltage.

The pre-correction voltage-to-ground measurement unit 20 according to the present embodiment includes a second measurement electrode 25 that is housed in a portion of the sole 17 of the other shoe worn by the worker and that faces the measurement electrode 21 with a dielectric (the spacer 24) having the same shape as the measurement electrode 21, and the voltmeter 22 that measures a voltage between the measurement electrode 21 and the second measurement electrode 25.

In the present embodiment, the measurement probe 23 (FIG. 5) is replaced with a body of the worker. The worker holds a conductor that is a measurement target in his or her hand.

Figure 13:
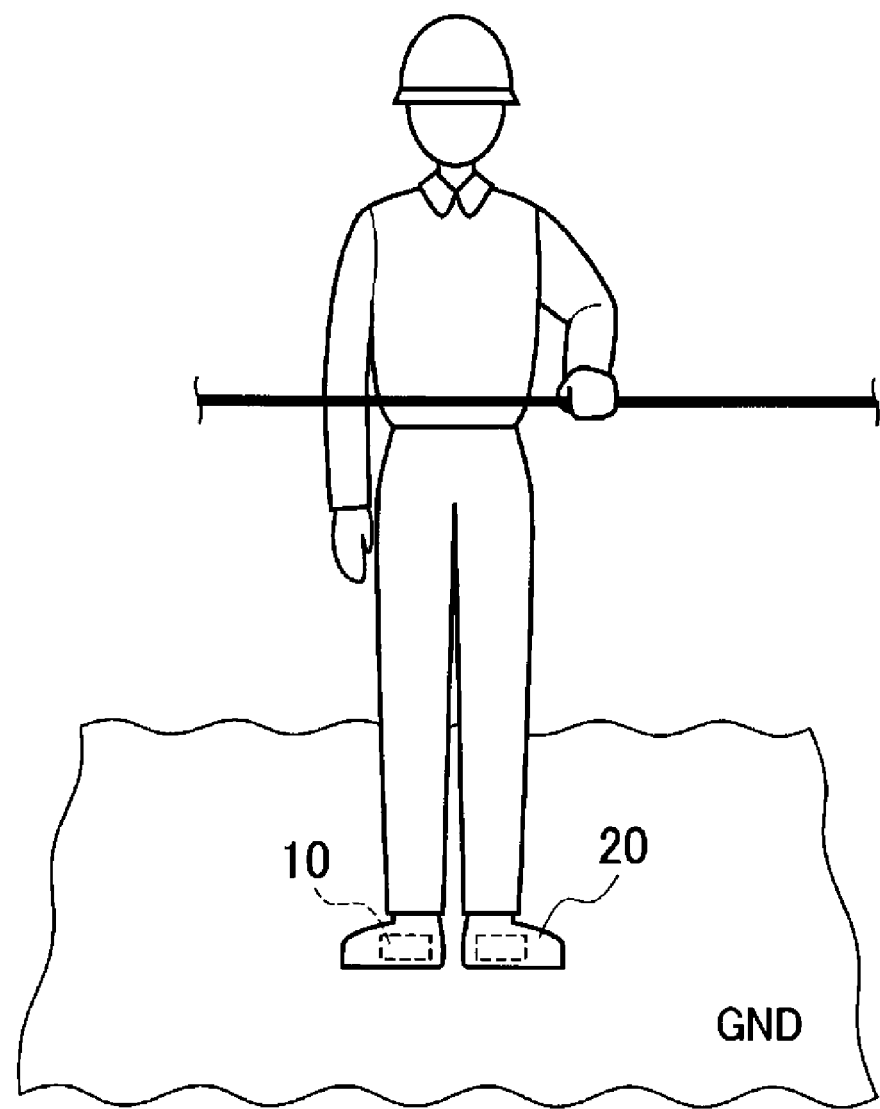
FIG. 13 is a diagram schematically illustrating a state of a worker wearing the shoes illustrated in FIGS. 10 and 11 and measuring a voltage-to-ground.

FIG. 13 is a diagram schematically illustrating a state of a worker wearing a couple of shoes including one shoe housing the resonant voltage measurement unit 10 and the other shoe housing the pre-correction voltage-to-ground measurement unit 20, who is holding a cable that is a measurement target in his or her hand. Note that the measurement target held by the worker may not be a cable as illustrated in FIG. 13. It may be a conductor provided in an electronic apparatus.

The voltage-to-ground when the cable is covered is divided into five impedances including (1) the impedance between the human body and the cable, (2) the impedance of the human body, (3) the impedance between the human body and the second measurement electrode 25, (4) the combined impedance of the impedance between the second measurement electrode 25 and the measurement electrode 21 and the input impedance to the voltmeter 22, and (5) the impedance between the measurement electrode 21 and the ground GND.

Thus, the voltage-to-ground correction unit 30 according to the present embodiment calculates the voltage-to-ground $V_n$ corrected from the voltage $V_m$ measured by the voltmeter 22 using the following equation.

[Math. 6]

$$V_n = V_m \left\{ 1 + \left( \frac{1}{j\omega_n C_m} + Z \right) \frac{1 + j\omega_n C_e Z_m}{Z_m} \right\} \quad (11)$$

Here, Z is the total impedance of (1), (2), and (3) described above. In addition, $C_m$ and $Z_m$ are the same as those in the equation (10). In addition, $C_e$ is a static capacitance between the measurement electrode 21 and the second measurement electrode 25 and can be calculated using the following equation.

[Math. 7]

$$C_e = \varepsilon_0 \varepsilon_r \frac{S_m}{d_a} \quad (12)$$

Here, $S_m$ is the area of the measurement electrode 21 and the second measurement electrode 25, and $d_a$ is the interval between the measurement electrode 21 and the second measurement electrode 25.

Figure 14:
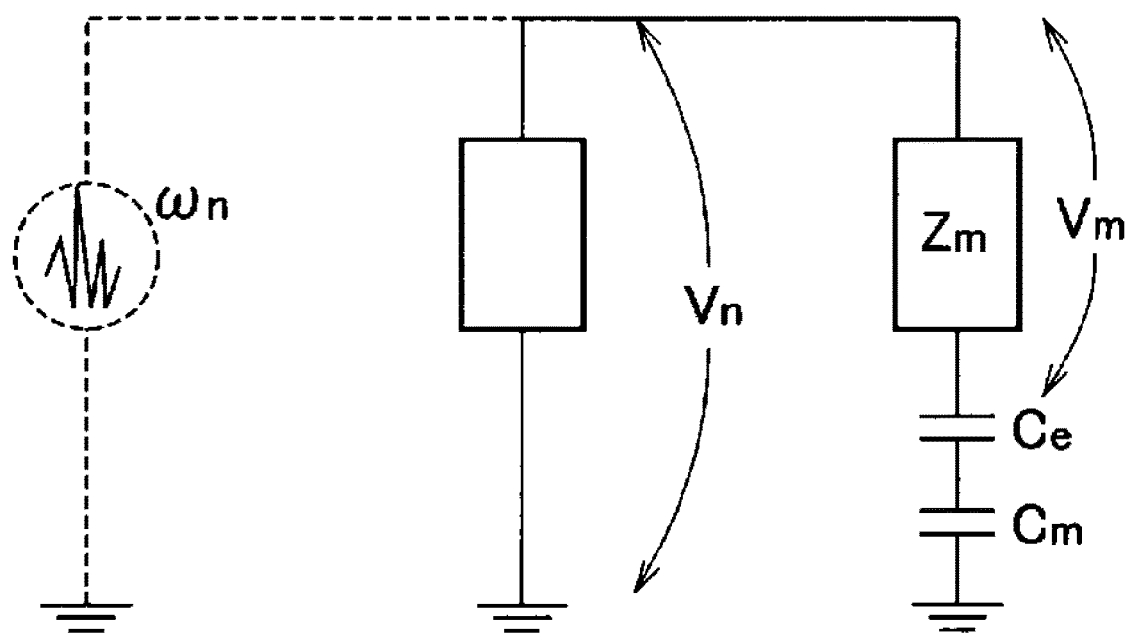
FIG. 14 is a diagram illustrating an equivalent circuit in a case in which the pre-correction voltage-to-ground measurement unit illustrated in FIG. 11 measures a voltage-to-ground.

FIG. 14 is an equivalent circuit illustrating a relationship between the voltage-to-ground $V_n$ and the pre-correction voltage-to-ground $V_m$ according to the present embodiment. As illustrated in FIG. 14, the underrated pre-correction voltage-to-ground $V_m$ is corrected to the correct voltage-to-ground $V_n$ using the equation (12). According to the present embodiment described above, a voltage-to-ground measurement device capable of measuring an accurate voltage-to-ground using shoes and a body of a worker can be provided.

According to the voltage-to-ground measurement devices 100 and 200 according to the present embodiment described above, accurate measurement of the voltage-to-ground can be achieved without grounding the measurement device. In addition, because the resonance phenomenon is used, the relationship between a static capacitance and a voltage to the ground GND can be reliably measured with a simpler configuration.

In addition, the voltage-to-ground measurement device 200 can reduce the number of apparatuses brought in the site in which a voltage-to-ground is measured and thus reduce the burden on the worker.

Further, the planar shape of the upper electrode 13 and the lower electrodes 14a and 14b illustrated in the embodiments described above is a mere example, and are not limited to the fan shape. For example, it may be a square shape. Furthermore, although the example in which the upper electrode 13 is rotated is illustrated, the lower electrodes 14a and 14b may be rotated.

It is a matter of course that various embodiments and the like that are not described herein are also included in the present invention. Thus, the technical scope of the present invention is defined only invention-specific matters according to the claims that are appropriate based on the description above.

REFERENCE SIGNS LIST

10 Resonant voltage measurement unit
11 Voltage measurement unit
12 Oscillation unit
13 Upper electrode
14a, 14b Lower electrode
15 Spacer
16 Central shaft
17 Sole
18 Insole
19 Upper
20 Pre-correction voltage-to-ground measurement unit
21 Measurement electrode
22 Voltage measurement device (voltmeter)
23 Measurement probe
24 Spacer
25 Second measurement electrode
30 Voltage-to-ground correction unit
100, 200 Voltage-to-ground measurement device

The invention claimed is:

1. A voltage-to-ground measurement device that measures a voltage-to-ground of a conductor constituting a unit of an electronic apparatus, the voltage-to-ground measurement device comprising configured to:

input a predetermined frequency signal to a circuit including a fixed capacitance formed between a ground and a lower electrode, a variable capacitance formed between an upper electrode that is disposed above the lower electrode and the ground or between the lower electrode and the upper electrode, and a resonance inductor to measure a resonant voltage that is dependent on a current flowing in the resonance inductor when the variable capacitance is changed to cause the circuit to resonate;

measure a pre-correction voltage-to-ground that is a voltage between a measurement electrode, which is disposed at an equal height to the lower electrode and forms a capacitance-to-ground between the measurement electrode and the ground, and a measurement probe connected to the conductor; and use the fixed capacitance, the variable capacitance, and the resonant voltage to obtain the capacitance-to-ground and to calculate a voltage-to-ground obtained by correcting the pre-correction voltage-to-ground using the capacitance-to-ground.

2. The voltage-to-ground measurement device according to claim 1, further comprising a resonant voltage measurement unit, wherein the resonant voltage measurement unit comprises:

two lower electrodes disposed at an equal height and parallel to the ground, the upper electrode disposed to face the lower electrodes with a dielectric interposed between the upper electrode and the lower electrodes, and the lower electrodes or the upper electrode are rotatable about a central shaft that is perpendicular to the ground.

3. The voltage-to-ground measurement device according to claim 1, wherein, when the voltage-to-ground is denoted by $V_n$, the pre-correction voltage-to-ground is denoted by $V_m$, the capacitance-to-ground is denoted by $C_m$, input impedance is denoted by $Z_m$, and an angular frequency of observed electromagnetic noise is denoted by 107 $_n$, the voltage-to-ground measurement device is configured to calculate $V_n$ using the following equation:

[Math. 8]

$$V_n = V_m\left(1 + \frac{1}{j\omega_n C_m}\frac{1}{Z_m}\right). \quad (13)$$

4. The voltage-to-ground measurement device according to claim 2,
   wherein the
   voltage-to-ground measurement device includes a second measurement electrode facing the measurement electrode with a dielectric interposed between the measurement electrode and the second measurement electrode and having the same shape as the measurement electrode, and a voltmeter configured to measure a voltage between the measurement electrode and the second measurement electrode.

5. The voltage-to-ground measurement device according to claim 4, wherein, when the voltage-to-ground is denoted by $V_n$, the pre-correction voltage-to-ground is denoted by $V_m$, the capacitance-to-ground is denoted by $C_m$, input impedance is denoted by $Z_m$, an angular frequency of observed electromagnetic noise is denoted by $\omega_n$, an impedance between a person wearing shoes and the conductor is denoted by Z, and a capacitance between the measurement electrode and the second measurement electrode is denoted by Ce, the voltage-to-ground measurement device is configured to calculate $V_n$ using the following equation:

[Math. 9]

$$V_n = V_m\left\{1 + \left(\frac{1}{j\omega_n} + Z\right)\frac{1 + j\omega_n C_e Z_m}{Z_m}\right\}. \quad (14)$$

6. A voltage-to-ground measurement method performed by a voltage-to-ground measurement device, the voltage-to-ground measurement method comprising:
   forming a fixed capacitance and a variable capacitance between any of a lower electrode and an upper electrode disposed at different heights from a ground and the ground and inputting a predetermined frequency signal to a circuit including the fixed capacitance, the variable capacitance, and a resonance inductor to measure a resonant voltage that is dependent on a current flowing in the resonance inductor when the variable capacitance is changed to cause the circuit to resonate;
   measuring a pre-correction voltage-to-ground that is a voltage between a measurement electrode, which is disposed at an equal height to the lower electrode and forms a capacitance-to-ground between the measurement electrode and the ground, and a measurement probe connected to a conductor constituting a unit of an electronic apparatus that is a measurement target; and
   using the fixed capacitance, the variable capacitance, and the resonant voltage to obtain the capacitance-to-ground and to calculate a voltage-to-ground obtained by correcting the pre-correction voltage-to-ground using the capacitance-to-ground.

7. The voltage-to-ground measurement method according to claim 6, wherein the voltage-to-ground measurement device used to perform the voltage-to-ground measurement method includes
   two lower electrodes disposed at an equal height and parallel to the ground,
   the upper electrode disposed to face the lower electrodes with a dielectric interposed between the upper electrode and the lower electrodes, and
   the lower electrodes or the upper electrode are rotatable about a central shaft that is perpendicular to the ground.

8. The voltage-to-ground measurement method according to claim 6, wherein, when the voltage-to-ground is denoted by $V_n$, the pre-correction voltage-to-ground is denoted by $V_m$, the capacitance-to-ground is denoted by $C_m$, input impedance is denoted by $Z_m$, and an angular frequency of observed electromagnetic noise is denoted by $\omega_n$, and calculating $V_n$ using the following equation:

[Math. 8]

$$V_n = V_m\left(1 + \frac{1}{j\omega_n C_m}\frac{1}{Z_m}\right). \quad (13)$$

9. The voltage-to-ground measurement method according to claim 6, further comprising:
   wherein the voltage-to-ground measurement device includes a second measurement electrode facing the measurement electrode with a dielectric interposed between the measurement electrode and the second measurement electrode and having the same shape as the measurement electrode, and a voltmeter configured to measure a voltage between the measurement electrode and the second measurement electrode.

10. The voltage-to-ground measurement method according to claim 9, wherein, when the voltage-to-ground is denoted by $V_n$, the pre-correction voltage-to-ground is denoted by $V_m$, the capacitance-to-ground is denoted by $C_m$, input impedance is denoted by $Z_m$, an angular frequency of observed electromagnetic noise is denoted by $\omega_n$, an impedance between a person wearing shoes and the conductor is denoted by Z, and a capacitance between the measurement electrode and the second measurement electrode is denoted by Ce, calculating $V_n$ using the following equation:

[Math. 9]

$$V_n = V_m\left\{1 + \left(\frac{1}{j\omega_n} + Z\right)\frac{1 + j\omega_n C_e Z_m}{Z_m}\right\}. \quad (14)$$

\* \* \* \* \*